United States Patent
Tomokawa

(10) Patent No.: US 10,824,032 B2
(45) Date of Patent: Nov. 3, 2020

(54) DISPLAY DEVICE AND METHOD OF PRODUCING THE SAME

(71) Applicant: Sharp Kabushiki Kaisha, Sakai (JP)

(72) Inventor: Shinji Tomokawa, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 16/500,425

(22) PCT Filed: Apr. 4, 2018

(86) PCT No.: PCT/JP2018/014377
§ 371 (c)(1),
(2) Date: Oct. 3, 2019

(87) PCT Pub. No.: WO2018/190212
PCT Pub. Date: Oct. 18, 2018

(65) Prior Publication Data
US 2020/0041831 A1 Feb. 6, 2020

(30) Foreign Application Priority Data
Apr. 11, 2017 (JP) ................................. 2017-078052

(51) Int. Cl.
*H05K 1/00* (2006.01)
*H05K 1/02* (2006.01)
(Continued)

(52) U.S. Cl.
CPC ......... *G02F 1/13452* (2013.01); *H05K 1/189* (2013.01); *H05K 2201/10136* (2013.01); *H05K 2201/2036* (2013.01)

(58) Field of Classification Search
CPC . H05K 1/00; H05K 1/02; H05K 1/189; G02F 1/13; G02F 1/134; G02F 1/1333;
(Continued)

(56) References Cited

U.S. PATENT DOCUMENTS

2009/0103002 A1* 4/2009 Enomoto .......... G02F 1/133308
349/60
2014/0022472 A1 1/2014 Kikuchi et al.
(Continued)

FOREIGN PATENT DOCUMENTS

JP 2013-145398 A 7/2013
JP 2014-026218 A 2/2014
(Continued)

OTHER PUBLICATIONS

Official Communication issued in International Patent Application No. PCT/JP2018/014377, dated Jun. 19, 2018.

*Primary Examiner* — Xiaoliang Chen
(74) *Attorney, Agent, or Firm* — Keating & Bennett, LLP

(57) ABSTRACT

A display device includes a first substrate, a second substrate, s driver circuit, a first substrate connecting member, a spacer portion, and a spacer joint portion. The second substrate is opposed to overlap the first substrate and includes a first substrate non-overlapping portion not overlapping the first substrate. The driver circuit is mounted on the first substrate non-overlapping portion on a same side as the first substrate. The first substrate connecting member is connected to the first substrate and includes a portion disposed to overlap the driver circuit. The spacer portion is disposed between the first substrate connecting member and the driver circuit. The spacer portion has an insulating property. The spacer joint portion is disposed to overlap a section of the first substrate non-overlapping portion not overlapping at least the driver circuit on the same side as the first substrate.

11 Claims, 10 Drawing Sheets

(51) Int. Cl.
  *G02F 1/13*       (2006.01)
  *G02F 1/1333*     (2006.01)
  *H01L 23/36*      (2006.01)
  *G02F 1/1345*     (2006.01)
  *H05K 1/18*       (2006.01)

(58) Field of Classification Search
  CPC ........... G02F 1/13452; G02F 1/133305; G02F
        1/133308; G02F 1/133385; G06F 3/044;
        G06F 3/0412; G06F 3/0416; H01L 23/36
  USPC .... 361/748, 749; 345/87, 89, 104, 204, 211;
        349/12, 59, 60, 93, 110, 149, 151, 153,
        349/155
  See application file for complete search history.

(56) References Cited

U.S. PATENT DOCUMENTS

| | | |
|---|---|---|
| 2014/0028939 A1 | 1/2014 | Nakano |
| 2015/0092362 A1* | 4/2015 | Ahn ................. G02F 1/133305 361/749 |
| 2017/0148702 A1* | 5/2017 | Funayama ........ G02F 1/133385 |

FOREIGN PATENT DOCUMENTS

| | | |
|---|---|---|
| JP | 2015-206815 A | 11/2015 |
| WO | 2012/133035 A1 | 10/2012 |

* cited by examiner

DISPLAY DEVICE AND METHOD OF PRODUCING THE SAME

TECHNICAL FIELD

The present invention relates to a display device and a method of producing the display device.

BACKGROUND ART

A liquid crystal display device including an integrated circuit module described in Patent Document 1 has been known as an example of such a display device. The integrated circuit module in the liquid crystal display device described in Patent Document 1 includes a driver IC, a first flexible printed circuit on which the driver IC is mounted, a driver IC, a second flexible printed circuit on which the driver IC is mounted, a first heatsink portion, a second heatsink portion, and a heatsink plate. The first heatsink portion is disposed on an opposite side from the driver IC on the first flexible printed circuit. The second heatsink portion is disposed on an opposite side from the driver IC on the second flexible printed circuit. The heatsink plate is disposed between the driver IC and the second flexible printed circuit.

RELATED ART DOCUMENT

Patent Document

Patent Document 1: Japanese Unexamined Patent Application Publication No. 2015-206815

Problem to be Solved by the Invention

Patent Document 1 discusses rises in temperature of the driver ICs that are disposed to overlap each other as a problem. Problems other than the rises in temperature may occur. If a frame of the liquid crystal display device is further narrowed, a distance between a connecting point of each flexible to the liquid crystal panel circuit board and the driver IC may decrease. A connecting portion (a terminal) of the second flexible printed circuit connected to the liquid crystal panel may be electrically connected to the driver IC due to displacement of the flexible printed circuits relative to the liquid crystal panel during mounting the flexible printed circuits to the liquid crystal panel. Furthermore, a portion of the liquid crystal panel to which the flexible printed circuits are mounted includes a single component substrate. Therefore, when a stress is concentrated on the portion, the portion may be easily damaged.

DISCLOSURE OF THE PRESENT INVENTION

The present invention was made in view of the above circumstances. An object is to reduce short circuits between a substrate connecting component and a driver circuit. Another object is to reduce damages of the driver circuit and a first substrate non-overlapping portion.

Means for Solving the Problem

A display device according the present invention includes a first substrate, a second substrate, a driver circuit, a first substrate connecting member, a spacer portion, and at least one spacer joint portion. The second substrate is opposed to overlap the first substrate and includes a first substrate non-overlapping portion not overlapping the first substrate. The driver circuit is mounted on the first substrate non-overlapping portion on the same side as the first substrate. The first substrate connecting member is connected to the first substrate and including a portion disposed to overlap the driver circuit. The spacer portion is disposed between the first substrate connecting member and the driver circuit. The spacer portion has an insulating properly. The at least one spacer joint portion is disposed to overlap a section of the first substrate non-overlapping portion not overlapping at least the driver circuit on the same side as the first substrate.

In this configuration, the spacer having the insulating properly is disposed between the first substrate connecting member connected to the first substrate and the driver circuit mounted on the first substrate non-overlapping portion of the second substrate not overlapping the first substrate on the same side as the first substrate. According to the configuration, a short circuit is less likely to occur between the first substrate connecting member and the driver circuit. Furthermore, the spacer joint portion is disposed on the section of the first substrate non-overlapping portion not overlapping at least the driver circuit on the same side as the first substrate. According to the configuration, a step between the driver circuit overlapping the first substrate non-overlapping portion from the same side as the first substrate and the section of the first substrate non-overlapping portion not overlapping the driver circuit can be reduced. If a stress is exerted on the first substrate non-overlapping portion, concentration of stress in a specific area is less likely to occur. Furthermore, the spacer joint portion is coupled to the spacer portion. Therefore, the number of parts is reduced and easiness in parts control increases. Furthermore, steps in assembly process are reduced. This configuration is preferable for reducing.

Preferred embodiments of the display device according to the present invention may have following configuration.

(1) The display device further includes a second substrate connecting member connected to a section of the first substrate non-overlapping portion on an opposite die from the first substrate relative to the driver circuit. The at least one spacer joint portion is disposed not to overlap the second substrate connecting member. According to the configuration, the spacer joint portion is less likely to adversely affect connection between the first substrate non-overlapping portion and the second substrate connecting member.

(2) The display device further includes a second spacer portion disposed between the first substrate connecting member and the second substrate connecting member. The second spacer portion has an insulating properly and is coupled to the spacer portion and the at least one spacer joint portion. During attachment of the spacer portion, the at least one spacer joint portion, and the second spacer portion to the first substrate non-overlapping portion of the second, the spacer portion may be displaced toward the first substrate relative to the driver circuit. Even in such a case, a section of the second spacer portion is disposed between the driver circuit and the first substrate connecting member. Namely, even if the spacer portion is displaced relative to the driver circuit, a short circuit is less likely to occur between the first substrate connecting member and the driver circuit because of the second spacer portion.

(3) The at least one spacer joint portion is coupled to the spacer portion and the second spacer portion linearly in an arrangement direction in which the spacer portion and the second spacer portion are arranged. In comparison to a configuration in which the spacer joint portion is not arranged linearly to the arrangement direction in which the spacer portion and the second spacer portion are arranged and a step may be present at a border between the spacer joint portion and the spacer portion or the second spacer portion, concentration of stress at the border. Therefore, a break is less likely to occur at the border.

(4) The display device further includes an adhesive layer affixed to the first substrate non-overlapping portion. The adhesive layer is formed on the at least one spacer joint portion among the spacer portion, the at least one spacer joint portion, and the second spacer portion. With the adhesive layer affixed to the first substrate non-overlapping portion, the spacer joint portion is fixed to the first substrate non-overlapping portion. Therefore, the concentration of stress at the first substrate non-overlapping portion is further less likely to occur. The adhesive layer is not affixed to the spacer portion disposed between the driver circuit and the first substrate connecting member and the second spacer portion disposed between the first substrate connecting member and the second substrate connecting member. During the attachment of the spacer portion, the spacer joint portion, and the second spacer portion that are coupled to one another, a position of the spacer portion relative to the driver circuit and a position of the second spacer portion relative to the first substrate connecting member are easily adjustable. This configuration can provide high workability in the production.

(5) The at least one spacer joint portion has a thickness equal to or greater than a height of the driver circuit from the first substrate non-overlapping portion. In comparison to a configuration in which the thickness of the spacer joint portion is less than the height of the driver circuit, a step between the driver circuit mounted on the first substrate non-overlapping portion via the spacer joint portion and the section of the first substrate non-overlapping portion not overlapping the driver circuit is more properly reduced. Therefore, the concentration of stress is further less likely to occur when the stress is exerted on the first substrate non-overlapping portion and thus the first substrate non-overlapping portion and the driver circuit are further less likely to be damaged.

(6) The at least one spacer joint portion includes a surface on an opposite side from the first substrate non-overlapping portion flush with a surface of the spacer portion on the opposite side. According to the configuration, a step is less likely to be present between the surfaces of the spacer joint portion and the spacer portion on the opposite side from the first substrate non-overlapping portion.

(7) The at least one spacer joint portion includes two spacer joint portions that sandwich the spacer portion in an arrangement direction in which the spacer joint portions and the spacer portion are arranged. With the spacer joint portions that sandwich the spacer portion in the arrangement direction, the concentration of stress is less likely to occur when the stress is exerted on the first substrate non-overlapping portion. Therefore, the first substrate non-overlapping portion and the driver circuit are further less likely to be damaged. Furthermore, the spacer joint portions are coupled to the spacer portion, that is, the spacer joint portions and the spacer portion are provided as a single component. This configuration is preferable for reducing the production cost.

(8) The display device further includes a substrate protecting member opposed to the first substrate on an opposite side from the second substrate such that the driver circuit, the spacer portion, and the first substrate connecting member are sandwiched between the substrate protecting member and the first substrate non-overlapping portion. With the substrate protecting member, the first substrate and the second substrate are protected. If a gap is created between the substrate protecting member and the first substrate connecting member, a stress is more likely to be exerted on the first substrate non-overlapping portion. The concentration of stress in a specific area of the first substrate non-overlapping portion is less likely to occur because of the at least one spacer joint portion. Therefore, the first substrate non-overlapping portion and the driver circuit are less likely to be damaged.

A method of producing the display device according to the present invention includes a substrate bonding step, a driver circuit mounting step, a spacer disposing step, a first substrate connecting member connecting step, and a first substrate connecting member connecting step. The substrate bonding step includes bonding of the second substrate to the first substrate such that the second substrate is opposed to the first substrate and includes a first substrate non-overlapping portion not overlapping the first substrate. The driver circuit mounting step includes mounting of the driver circuit to the first substrate non-overlapping portion on the same side as the first substrate. The spacer disposing step includes disposing of the spacer portion having the insulating properly on the first substrate non-overlapping portion on the same side as the first substrate and the spacer joint portion to the section of the first substrate non-overlapping portion not overlapping at least the driver circuit on the same side as the first substrate. The first substrate connecting member connecting step includes connecting of the first substrate connecting member to the first substrate such that the portion of the first substrate connecting member overlaps the driver circuit and the spacer portion is sandwiched between the first substrate connecting member and the driver circuit.

When the spacer disposing step is performed after the substrate bonding step and the driver circuit mounting step are completed, the spacer portion is disposed on the driver circuit on the same side as the first substrate and the spacer joint portion coupled to the spacer portion is disposed on the section of the first substrate non-overlapping portion not overlapping at least the driver circuit on the same side as the first substrate. A step between the driver circuit mounted on the first substrate non-overlapping portion via the spacer joint portion and the section of the first substrate non-overlapping portion not overlapping the driver circuit is reduced. Therefore, the concentration of stress in a specific area when the stress is exerted on the first substrate non-overlapping portion and thus the first substrate non-overlapping portion and the driver circuit are less likely to be damaged. Then, when the first substrate connecting member connecting step is performed, the first substrate connecting member is connected to the first substrate. The portion of the first substrate connecting member is disposed to overlap the driver circuit and the spacer portion is sandwiched between the portion of the first substrate connecting member and the driver circuit. Therefore, a short circuit is less likely to occur between the first substrate connecting member and the driver circuit. The spacer joint portion is coupled to the spacer portion. Therefore, the number of parts is reduced and the easiness in parts control increases. Furthermore, steps in assembly process are reduced. This configuration is preferable for reducing.

Preferred embodiments of a method of producing the display device according to the present invention may include following steps.

(1) The spacer disposing step includes a substrate placing step and a spacer positioning step. The substrate placing step includes placing of the first substrate and the second substrate on a jig. The spacer positioning step includes positioning of the spacer portion and the spacer joint portion by fitting a jig-side positioning portion of the jig to a separator-side positioning portion of separator to which the spacer portion and the spacer joint portion are attached on an opposite side from the driver circuit to be detachable. The separator-side positioning portion is located in the spacer non-overlapping portion of the separator not overlapping the spacer portion and the spacer joint portion.

Advantageous Effect of the Invention

According to the present invention, a short circuit is less likely to occur between a substrate connecting component and a driver circuit. Furthermore, the driver circuit and a first substrate non-overlapping portion are less likely to be damaged. When the spacer positioning step is performed after the first substrate and the second substrate are placed on the jig in the substrate placing step, the separator-side positioning portion in the spacer non-overlapping portion of the separator and the jig-side positioning portion of the jig are fitted together and thus the spacer portion and the spacer joint portion attached to the separator to be detachable are positioned relative to the first substrate non-overlapping portion and the driver circuit. The spacer portion is properly disposed between the spacer portion and the first substrate connecting member. The spacer joint portion is properly disposed to overlap the section of the first substrate non-overlapping portion not overlapping the driver circuit. After the positioning, the spacer portion and the spacer joint portion are attached to at least the first substrate non-overlapping portion and the separator is removed from the spacer portion and the spacer joint portion.

MODES FOR CARRYING OUT THE INVENTION

First Embodiment

Figure 1:
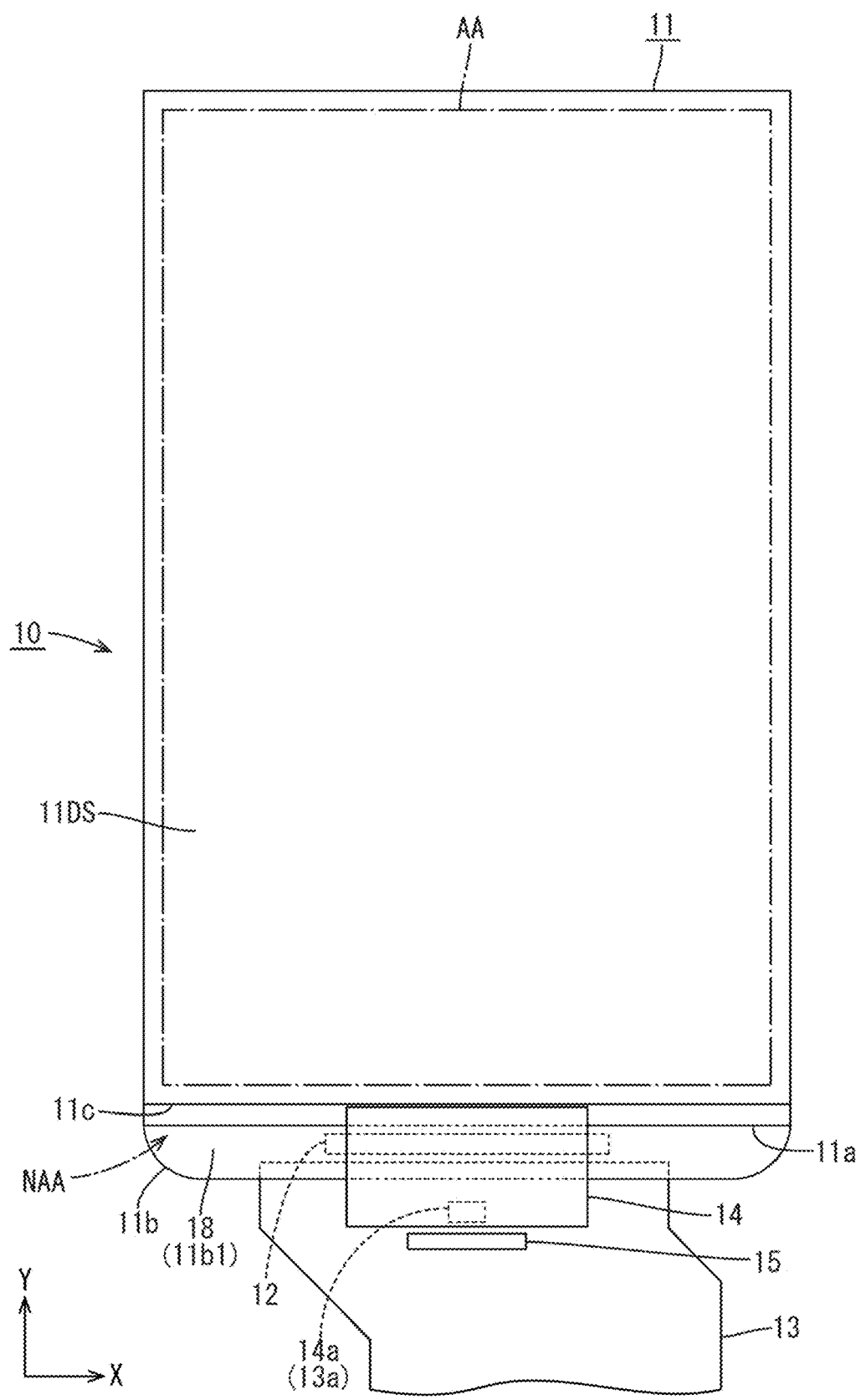
FIG. 1 is a plan view of a liquid crystal panel according to a first embodiment.

A first embodiment will be described with reference to FIGS. 1 to 9. In this embodiment section, a liquid crystal display device 10 including not only a display function but also a touch panel function (a position input function) will be described. X-axes, Y-axes, and Z-axes may be present in the drawings. The axes in each drawing correspond to the respective axes in other drawings. An upper side and a lower side in FIGS. 4 to 6 and FIG. 9 correspond to a front side and a backside of the liquid crystal display device 10, respectively.

Configurations of the liquid crystal display device 10 will be described. As illustrated in FIG. 1, the liquid crystal display device 10 has a horizontally-long rectangular overall shape. The liquid crystal display device 10 includes at least a liquid crystal panel 11 (a display panel, a display panel with a position input function), a cover glass 24 (a substrate protecting member), and a backlight unit (not illustrated). The liquid crystal panel 11 includes a front plate surface that is configured as a display surface 11DS on which images are displayed. The cover glass 24 is disposed to cover the display surface 11DS of the liquid crystal panel 11 from the front side. The backlight unit is configured to apply illumination light to the liquid crystal panel 11 for image display. The liquid crystal display device 10 may be used for a portable information terminal such as a smartphone. A screen size of the liquid crystal panel 11 is in a small size category (a size range of some inches).

Figure 4:
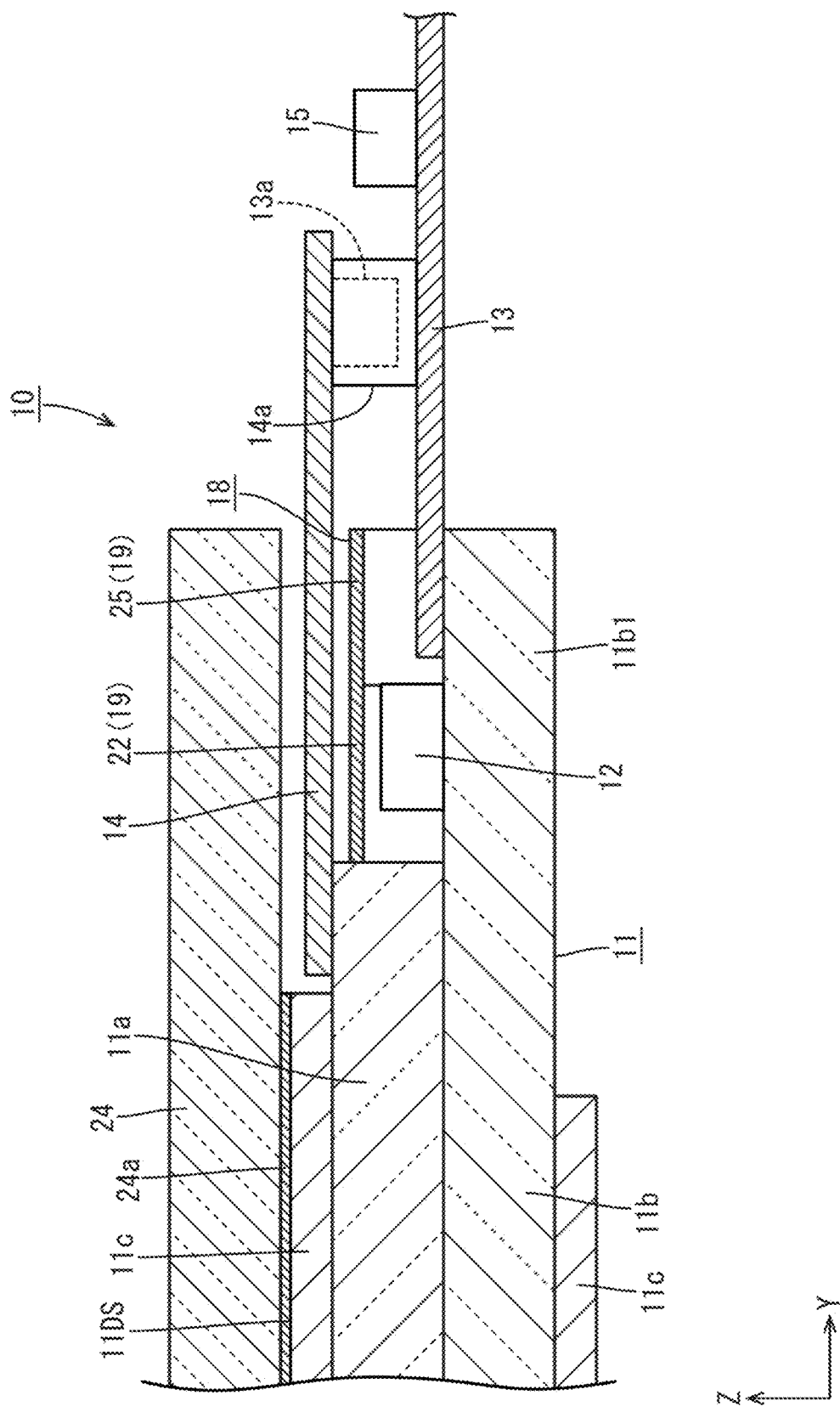
FIG. 4 is a cross-sectional view along line A-A in FIG. 3.

As illustrated in FIG. 4, the liquid crystal panel 11 includes at least two substantially transparent glass substrates 11a and 11b and a liquid crystal layer (not illustrated). The substrates 11a and 11b are held such that inner surfaces of the substrates 11a and 11b are opposed to each other with a predefined gap (a cell gap) and bonded together. One of the substrates 11a and 11b disposed on the front side is a CF substrate 11a (a first substrate, a common substrate). A color filter and a light blocking portion (a black matrix) are disposed on the CF substrate. The color filter includes red (R), green (G), and blue (B) light portions that are in predefined arrangement. The light blocking portion separates the adjacent color portions from one another. Furthermore, a structural object such as an alignment film is disposed on the CF substrate. On an array substrate 11b (a second substrate, an active matrix substrate), which is another one of the substrates disposed on the rear side, switching components (e.g., TFTs), pixel electrodes, and a structural object such as an alignment film are disposed. The switching components are connected to source lines and gate lines that are perpendicular to one another. The pixel electrodes are connected to the switching components. Polarizing plates 11c are bonded to outer surfaces of the substrates 11a and 11b, respectively. The display surface 11DS includes a surface of the polarizing plate 11c bonded to the front surface of the CF substrate 11a.

As illustrated in FIG. 1, the display surface 11DS of the liquid crystal panel 11 includes a display area (active area) AA in which images are displayed and a non-display area (non-display area) NAA in which images are not displayed. The non-display area NAA is in a frame shape to surround the display area AA. In FIG. 1, a chain line indicates a perimeter of the display area AA and an area outside the chain line is the non-display area. The CF substrate 11a in the liquid crystal panel 11 has a long dimension smaller than a long dimension of the array substrate 11b. The CF substrate 11a is bonded to the array substrate 11b with one of edge portions at an end of the long dimension thereof aligned with a corresponding one of edge portions of the array substrate 11b. The other one of the edge portions of the array substrate 11b at an end of the ling dimension projects from a side of the CF substrate 11a. The edge portion is disposed not to overlap the CF substrate 11a and thus defined as a CF substrate non-overlapping portion 11b1. The CF substrate non-overlapping portion 11b1 is included in the non-display area NAA. In the CF substrate non-overlapping portion 11b1, a driver 12 (a driver circuit, a panel driver) for image display is mounted. An array substrate flexible printed circuit 13 (a second substrate connecting component) having a function of transmitting signals related to the display function to the driver 12 is connected to the CF substrate non-overlapping portion 11b1. The driver 12 and the array substrate flexible printed circuit 13 are disposed to overlap the CF substrate non-overlapping portion 11b1 from the front side (the same side as the CF substrate 11a) with respect to the Z-axis direction. A CF substrate flexible printed circuit 14 (a first substrate connecting component) for transmitting signals related to the touch panel function is connected to the edge portion of the CF substrate 11a on a CF substrate non-overlapping portion 11b1 side. The CR substrate flexible printed circuit 14 is disposed to overlap the CF substrate 11a from the front side with respect to the Z-axis direction.

Figure 3:
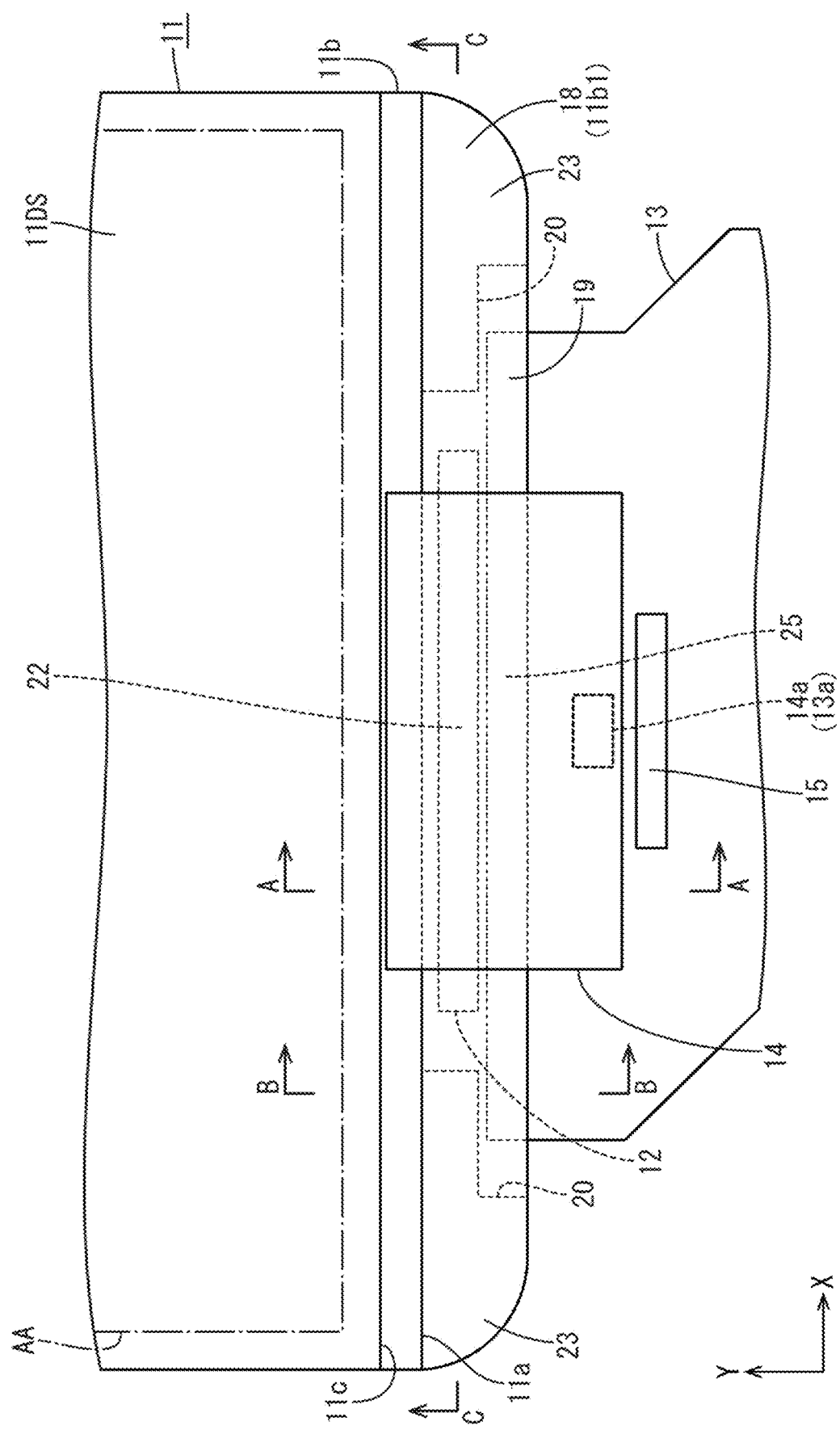
FIG. 3 is a magnified plan view illustrating a portion of the liquid crystal panel on which a driver and flexible printed circuits are mounted.

As illustrated in FIG. 3, the driver 12 includes an LSI chip that includes a driver circuit. The driver 12 is mounted on the CF substrate non-overlapping portion 11b1 of the array substrate 11b via an anisotropic conductive film (ACF) with the chip-on-glass (COG) technology. The driver 12 is disposed such that the CF substrate 11a is closer to the driver 12 than the array substrate flexible printed circuit 13 with respect to the Y-axis direction (a direction in which the driver 12 and the array substrate flexible printed circuit 13 are arranged) and at substantially the middle in the Y-axis direction. The driver 12 is configured to process various signals transmitted by the array substrate flexible printed circuit 13, to generate output signals, and to output to the output signals to the display area AA of the array substrate 11b.

As illustrated in FIG. 3, the array substrate flexible printed circuit 13 and the CF substrate flexible printed circuit 14 include film bases made of synthetic resin (e.g. polyimide-based resin), respectively, and have flexibility. The array substrate flexible printed circuit 13 and the CF substrate flexible printed circuit 14 include a large number of wiring patterns and terminal (not illustrated) on the bases. On end portions of the CF substrate a and the array substrate 11b, terminals (not illustrate) are disposed. The terminals are electrically connected to the terminals on the array substrate flexible printed circuit 13 and the CF substrate flexible printed circuit 14 via ACFs.

The array substrate flexible printed circuit 13 includes a first end portion and a second end portion. As illustrated in FIG. 3, the first end portion is connected to a section of the CF substrate non-overlapping portion 11b1 of the array substrate 11b closer to the edge relative to the driver 12 with respect to the Y-axis direction (on an opposite side from the CF substrate 11a). The second end portion is connected to the control circuit board (not illustrated), which is a signal source. With the configuration, signals related to the image display are transmitted from the control circuit board to the array substrate 11b. Furthermore, the array substrate flexible printed circuit 13 includes a power supply connector 13a and a touch driver 15. The power supply connector 13a is connectable to the CF substrate flexible printed circuit 14. The touch driver 15 is configured to process signals related to position detection. The signals related to the position detection supplied by the control circuit board are processed by the touch driver 15 and out signals are obtained. The output signals are transmitted to the CF substrate flexible printed circuit 14. The array substrate flexible printed circuit 13 has a dimension in the X-axis direction larger than that of the driver 12.

As illustrated in FIG. 3, the CF substrate flexible printed circuit 14 includes a first end portion and a second end portion. The first end portion is connected to an end of the CF substrate 11a on a driver 12 side with respect to the Y-axis direction. The second end portion is connected to the power supply connector 13a on the array substrate flexible printed circuit 13. The signals supplied by the control circuit board and processed by the touch driver 15 on the array substrate flexible printed circuit 13 can be transmitted to the CF substrate 11a via the CF substrate flexible printed circuit 14. A power receiving connector 14a is disposed on the second end portion of the CF substrate flexible printed circuit 14. The power receiving connector 14a is fitted in and connected to the power supply connector 13a. Portions of the CF substrate flexible printed circuit 14 overlap the driver 12 and the array substrate flexible printed circuit 13, respectively, in a plan view. The CF substrate flexible printed circuit 14 is disposed such that a large portion of the driver 12 and the first end portion of the array substrate flexible printed circuit 13 are sandwiched between the CF substrate non-overlapping portion 11b1 of the array substrate 11b and the CF substrate flexible printed circuit 14.

As illustrated in FIG. 4, the cover glass 24 has a vertically-long rectangular shape to cover an entire area of the liquid crystal panel 11 from the front side. With the cover glass 24, the substrates 11a and 11b included in the liquid crystal panel 11 are protected. The cover glass 24 is opposed to a surface of the CF substrate 11a on an opposite side from the array substrate 11b. At least the driver 12, the array substrate flexible printed circuit 13, and the CF substrate flexible printed circuit 14 are disposed between the cover glass 24 and the CF substrate 11a. The cover glass 24 is fixed to the polarizing plate 11c on the front side with a substantially transparent fixing tape 24a. The cover glass 24 is separated from the CF substrate flexible printed circuit 14 opposed to the back surface of the cover glass 24 by a predefined gap in the Z-axis direction. The cover glass 24 is a substantially transparent glass plate having high transmissivity. Preferably, the cover glass 24 is made of tempered glass. The tempered glass used for the cover glass 24 may be, but not limited to, chemically tempered glass prepared by forming chemically tempered layers on surfaces of a glass plate through chemical tempering.

Figure 2:
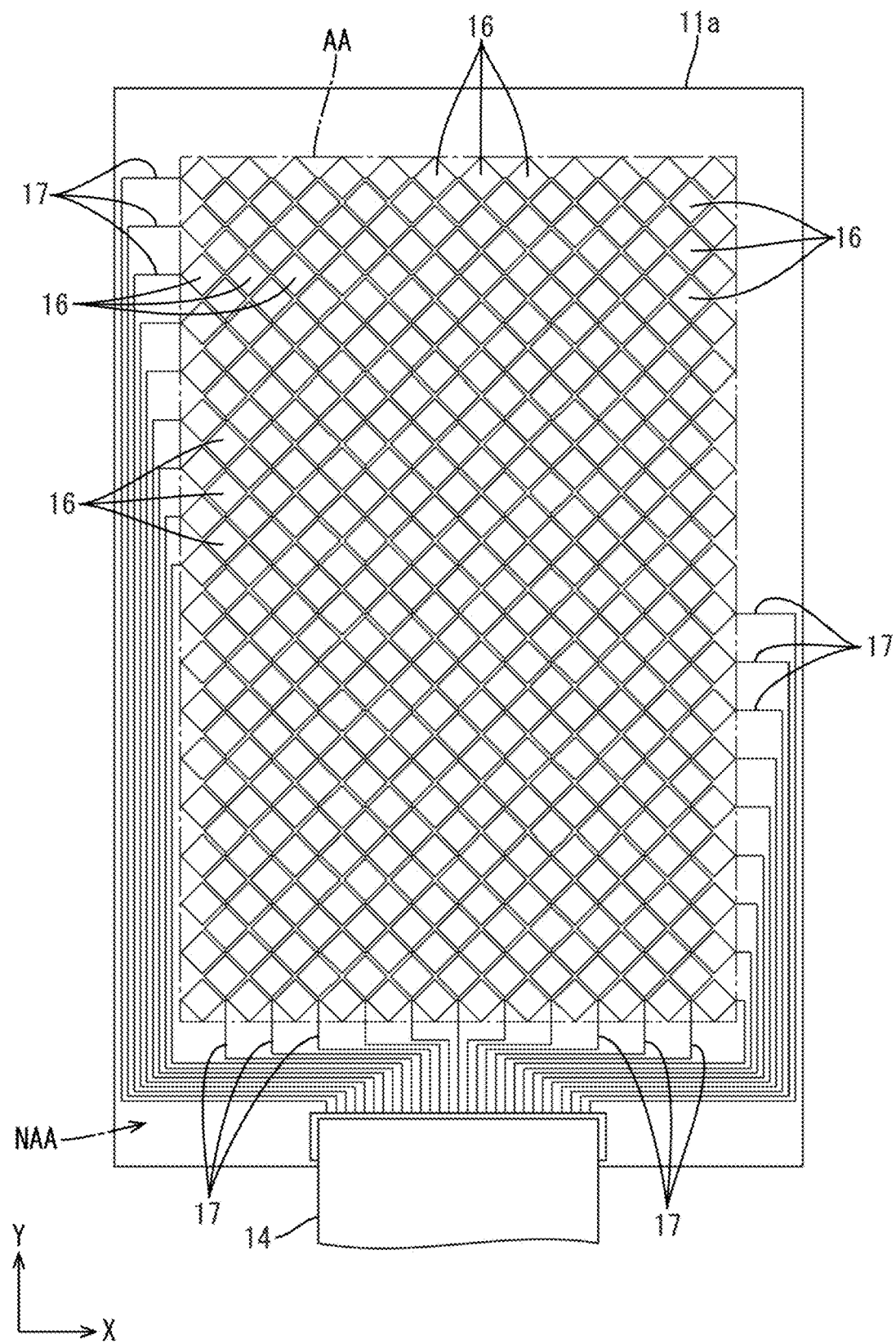
FIG. 2 is a plan view illustrating a touch panel pattern on a display surface of a CF substrate included in the liquid crystal panel.

As described earlier, the liquid crystal panel according to this embodiment has the display function to display images and the touch panel function (the position input function) to detect positions at which the user makes inputs based on the displayed images (the input positions). The touch panel pattern to perform the touch panel function is integrated (a semi in-cell touch panel). The touch panel pattern is a projected capacitive touch panel pattern and the position detection is performed using the mutual capacitance technology. As illustrated in FIG. 2, the touch panel pattern is on the CF substrate 11a, which is one of the substrates 11a and 11b. The touch panel pattern includes at least touch electrodes 16 (position detection electrodes) arranged in a matrix within a region of the display surface 11DS on the CF substrate 11a. The touch electrodes 16 are disposed the CF substrate 11a in the display area AA. Namely, the display area AA of the liquid crystal panel 11 substantially corresponds to a touch area in which the input positions are detectable. The non-display area NAA substantially corresponds to a non-touch area in which the input positions are not detectable. In the non-touch area outside the touch area corresponding to the non-display area NAA of the CF substrate 11a, edge area lines 17 including first ends connected to the touch electrodes and second ends connected to terminals connected to the CF substrate flexible printed circuit 14. When a finger of the user (a position input member) approaches the display surface 11DS to make a position input based on an image displayed in the display area AA and viewed by the user, capacitances occur between the finger and the touch electrodes 16. The capacitance detected by the touch electrode 16 near the finger varies as the finger approaches. The capacitance differs from the capacitances at the touch electrodes farther from the finger. The input position is detectable based on the differences.

Figure 5:
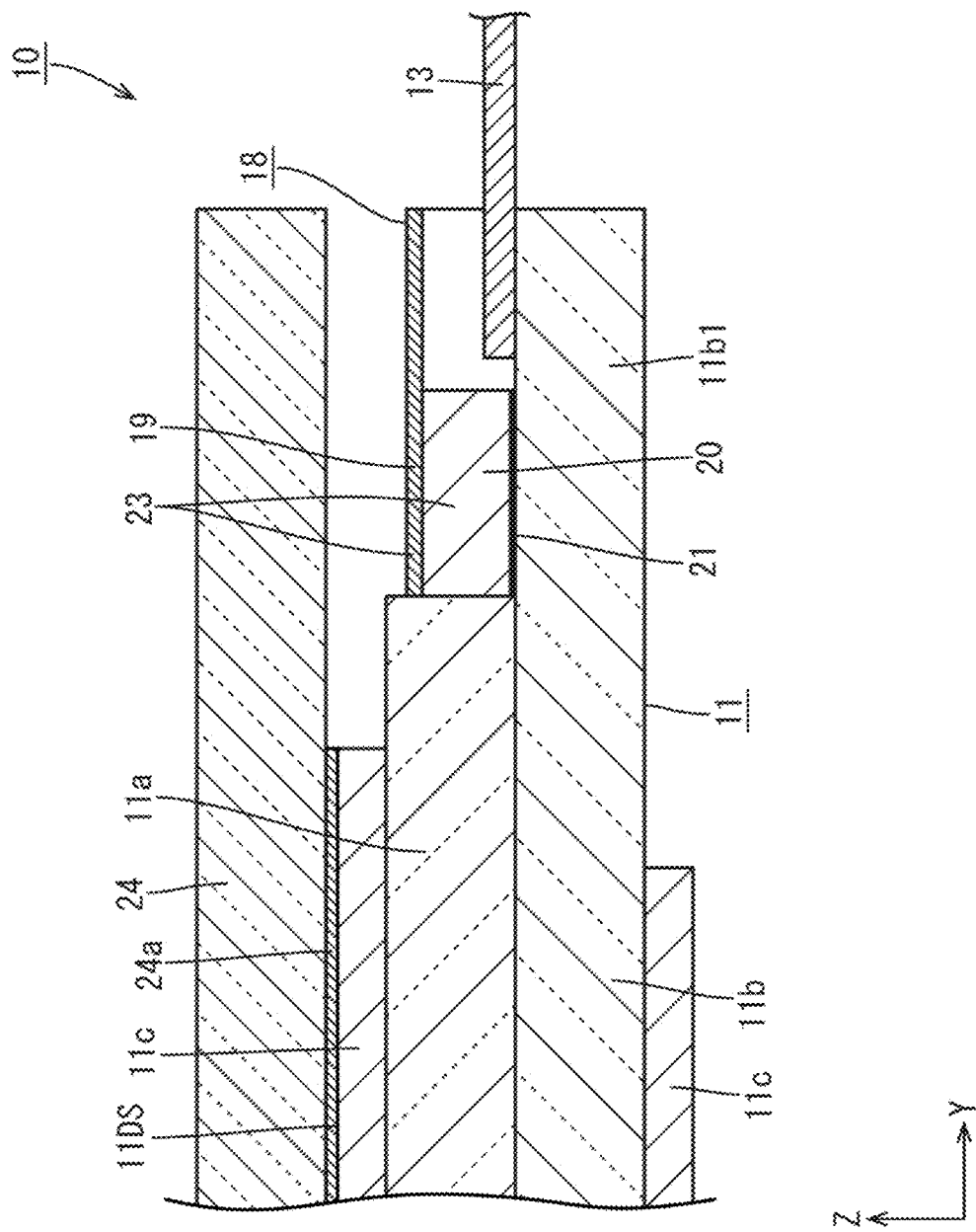
FIG. 5 is a cross-sectional view along line B-B in FIG. 3.
Figure 6:
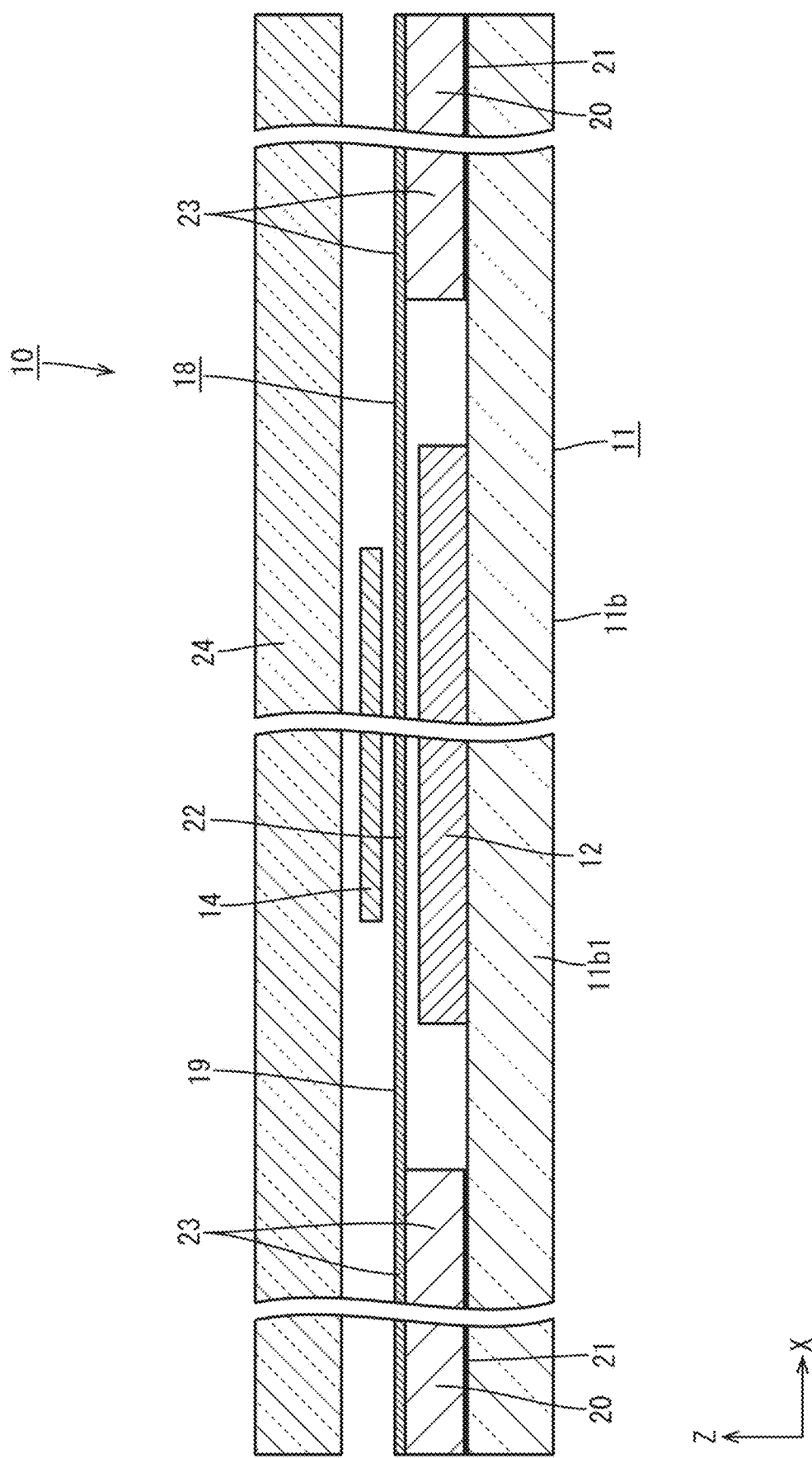
FIG. 6 is a cross-sectional view along line C-C in FIG. 3.

As illustrated in FIGS. 3 to 6, the liquid crystal panel 11 according to this embodiment includes a spacer 18. The spacer 18 has a horizontally-long shape extending in the X-axis direction. The spacer 18 is attached to the liquid crystal panel 11 to cover about an entire area of the CF substrate non-overlapping portion 11b1. The spacer 18 includes a film 19, blocks 20, and adhesive layers 21. The film 19 is made of a synthetic resin having an insulating property. The blocks 20 are made of a synthetic resin having an insulating property and fixed to the back of the film 19. The adhesive layers 21 are made of an adhesive material and formed on back surfaces of the blocks 20. The film 19 has a thickness less than a thickness of the blocks 20 and an area substantially corresponding to the CF substrate non-overlapping portion 11b1 in a plan view. The blocks 20 have a thickness greater than the thickness of the film 19 (or a height of the driver 12). The blocks 20 are fixed to end portions of the film 19 at ends of the long dimension of the film 19 (with respect to the X-axis direction), respectively. Each adhesive layer 21 covers about an entire area of the block 20 in a plan view. In FIGS. 5 and 6, thick lines indicate the adhesive layers 21.

As illustrated in FIGS. 3 to 6, the spacer 18 includes a spacer portion 22 and spacer joint portions 23. The spacer portion 22 is disposed between the driver 12 and the CF substrate flexible printed circuit 14. The spacer joint portions 23 are disposed to overlap sections of the CF substrate non-overlapping portion 11b1 from the front side (on the same side as the CF substrate 11a) in the Z-axis direction. The areas do not overlap at least the driver 12. The spacer joint portions 23 are coupled to the spacer portion 22. As illustrated in FIGS. 4 and 6, the spacer portion 22 is a portion of the film 19 not overlapping the blocks 20, specifically, a portion of the film 19 at the middle in the long dimension and closer to the CF substrate 11a in the Y-axis direction. The spacer portion 22 is located on the front side relative to the CF substrate non-overlapping portion 11b1 and opposed to the CF substrate non-overlapping portion 11b1 with a gap in the Z-axis direction. The spacer portion 22 is disposed between the driver 12 and the CF substrate flexible printed circuit 14. The spacer portion 22 is opposed to the driver 12 with a predefined gap and to the CF substrate flexible printed circuit 14 with a predefined gap, that is, the spacer portion 22 is held not to contact the driver and the CF substrate flexible printed circuit 14. As illustrated in FIGS. 5 and 6, each spacer joint portion 23 has a multilayer structure including the corresponding block 20 and a portion of the film 19 overlapping the corresponding block 20. The spacer joint portions 23 are located adjacent to the spacer portion 22 in the X-axis direction. Two spacer joint portions 23 are provided. The spacer joint portions 23 sandwich the spacer portion 22 at the middle in the X-axis direction (in a direction in which the spacer portion 22 and the spacer joint portions 23 are arranged). The areas of the spacer joint portions 23 correspond to the blocks 20 in a plan view. The film 19 of the spacer 18 extends to straddle the spacer portion 22 and the spacer joint portions 23. The film 19 has a function for coupling the spacer portion 22 and the spacer joint portions 23.

In the configuration described above, the spacer portion 22 having the insulating property is disposed between the CF substrate flexible printed circuit 14 connected to the CF substrate 11a and the driver 12 mounted on the CF substrate non-overlapping portion 11b1 of the array substrate 11b on the front side of the CF substrate non-overlapping portion 11b1 as illustrated in FIGS. 4 and 6. If the CF substrate flexible printed circuit 14 is mounted on the CF substrate 11a at a position off from a designed position in the Y-axis direction and the terminal portion of the CF substrate flexible printed circuit 14 partially overlaps the driver 12, a short circuit is less likely to occur between the terminal portion of the CF substrate flexible printed circuit 14 and the driver 12. As illustrated in FIGS. 5 and 6, the spacer joint portions 23 are disposed to overlap the sections of the CF substrate non-overlapping portion 11b1 not overlapping at least the driver 12 from the front side. The spacer joint portions 23 can compensate steps between the driver 12 overlapping the CF substrate non-overlapping portion 11b1 from the front side and the sections of the CF substrate non-overlapping portion 11b1 not overlapping the driver 12. According to the configuration, if an external force (stress) is exerted on the CF substrate non-overlapping portion 11b1, concentration of the stress in a specific area is less likely to occur. Therefore, the CF substrate non-overlapping portion 11b1 and the driver 12 mounted thereon are less likely to be damaged. In this embodiment, the gap is provided between the cover glass 24 and the CF substrate flexible printed circuit 14 and thus the CF substrate non-overlapping portion 11b1 tends to be subject to stress. With the spacer joint portions 23, the concentration of the stress in a specific area is less likely to occur in the CF substrate non-overlapping portion 11b1. Therefore, the CF substrate non-overlapping portion 11b1 and the driver 12 are less likely to be damaged. Because the spacer joint portions 23 are coupled to the spacer portion 22 and the number of parts is reduced and easiness in parts control increases. Furthermore, the steps in assembly process are reduced. This configuration is preferable for reducing the production cost. The spacer joint portions 23 are disposed to sandwich the spacer portion 22 in the X-axis direction. Therefore, the concentration of the stress is less likely to occur when the stress is exerted on the CF substrate non-overlapping portion 11b1 and thus the CF substrate non-overlapping portion 11b1 and the driver 12 are less likely to be damaged. The spacer joint portions 23 and the spacer portion 22 are portions of a single component. This configuration is preferable for reducing the production cost.

As illustrated in FIGS. 3 and 5, the spacer joint portions 23 are disposed not to overlap the array substrate flexible printed circuit 13. Each block 20 has a shape in a plan view such that a portion aligned to the array substrate flexible printed circuit 13 in the Y-axis direction is dented in the X-axis direction relative to a portion aligned to the driver 12 in the Y-axis direction. Therefore, the blocks 20 do not overlap the array substrate flexible printed circuit 13. According to the configuration, the spacer joint portions 23 are less likely to adversely affect connection between the CF substrate non-overlapping portion 11b1 and the array substrate flexible printed circuit 13.

As illustrated in FIG. 6, the spacer joint portions 23 have the thickness greater than the height of the driver 12 from the CF substrate non-overlapping portion 11b1. In comparison to a configuration including spacer joint portions having a thickness less than the height of the driver 12, the steps between the driver 12 mounted on the CF substrate non-overlapping portion 11b1 and the portions of the CF substrate non-overlapping portion 11b1 not overlapping the driver 12 can be more properly compensated by the spacer joint portions 23. Therefore, the concentration of the stress is less likely to occur when the stress is exerted on the CF substrate non-overlapping portion 11b1 and thus the CF substrate non-overlapping portion 11b1 and the driver 12 are less likely to be damaged. Furthermore, the thickness of the blocks 20 of the spacer joint portions 23 is greater than the height of the driver 12 and substantially equal to the gap between the CF substrate non-overlapping portion 11b1 and the spacer portion 22. The front surfaces of the spacer joint portions 23 (surfaces on an opposite side from the CF substrate non-overlapping portion 11b1) are flush with the front surface of the spacer portion 22. Because the front surfaces of the spacer joint portions 23 are flush with the front surface of the spacer portion 22, steps or wrinkles are less likely to be produced.

As illustrated in FIG. 4, the spacer 18 includes a second spacer portion 25 disposed between the array substrate flexible printed circuit 13 and the CF substrate flexible printed circuit 14. The second spacer portion 25 has an insulating property. The second spacer portion 25 is coupled to the spacer portion 22 and the spacer joint portions 23. The second spacer portion 25 includes a portion of the film 19 not overlapping the blocks 20 in the middle of the long dimension of the film 19 and on an opposite side from the CF substrate 11a in the Y-axis direction. Namely, the second spacer portion 25 is adjacent to the spacer portion 22 on an opposite side from the CF substrate 11a in the Y-axis direction. The second spacer portion 25 is opposed to the CF substrate non-overlapping portion 11b1 from the front side with a gap between the second spacer portion 25 and the CF substrate non-overlapping portion 11b1 in the Z-axis direction. The array substrate flexible printed circuit 13 is sandwiched between the CF substrate non-overlapping portion 11b1 and the second spacer portion 25. The second spacer portion 25 is sandwiched between the array substrate flexible printed circuit 13 and the CF substrate flexible printed circuit 14. In the configuration in which the spacer portion 22 is disposed between the driver 12 and the CF substrate flexible printed circuit 14, the second spacer portion 25 is disposed between the CF substrate flexible printed circuit 14 and the array substrate flexible printed circuit 13. In mounting of the spacer portion 22, the spacer joint portions 23, and the second spacer portion 25 that are coupled together, even if the spacer portion 22 is displaced toward the CF substrate 11a relative to the driver 12 in the Y-axis direction, a portion of the second spacer portion 25 having the insulating property is disposed between the driver 12 and the CF substrate flexible printed circuit 14. Even if the spacer portion 22 is displaced relative to the driver 12 in the Y-axis direction, the second spacer portion 25 reduces a short circuit between the CF substrate flexible printed circuit 14 and the driver 12.

Figure 7:
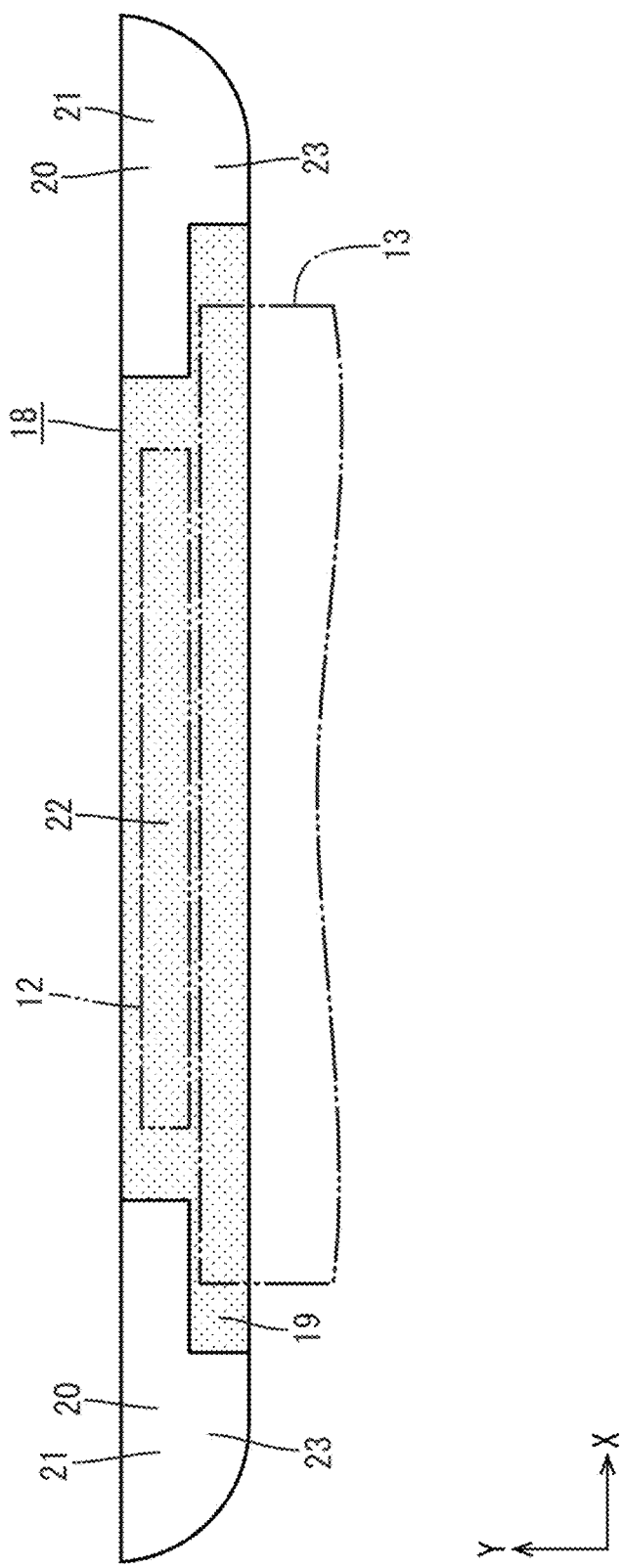
FIG. 7 is a bottom view of a spacer.

As illustrated in FIG. 7, the spacer joint portions 23 are coupled to the spacer portion 22 and the second spacer portion 25 linearly in the X-axis direction. In comparison to a configuration in which spacer joint portions are coupled to the first spacer portion 22 and the second spacer portion 25 not linearly in the X-axis direction and bumps (steps) are present at borders between the spacer portion 22 and the spacer joint portions or the second spacer portion 25 and the spacer joint portions, the concentration of stress is less likely to occur at borders between the spacer portion 22 and the spacer joint portions 23 or the second spacer portion 25 and the spacer joint portions 23. Therefore, the borders between the spacer portion 22 and the spacer joint portions 23 or the second spacer portion 25 and the spacer joint portions 23 are less likely to be broken. Furthermore, the adhesive layers 21 to be fixed to the CF substrate non-overlapping portion 11b1 are provided on the spacer joint portions 23 that form the spacer 18 together with the spacer portion 22, the second spacer portion 25. In FIG. 7, an area of the spacer 18 in which the adhesive layers 21 are not formed is indicated by hatching. With the adhesive layers 21 fixed to the CF substrate non-overlapping portion 11b1, the spacer joint portions 23 are fixed to the CF substrate non-overlapping portion 11b1. Therefore, the concentration of stress is less likely to occur at the CF substrate non-overlapping portion 11b1. The adhesive layers 21 are not provided on the spacer portion 22 that is disposed between the driver 12 and the CF substrate flexible printed circuit 14 and the second spacer portion 25 that is disposed between the CF substrate flexible printed circuit 14 and the array substrate flexible printed circuit 13. During attachment of the spacer portion 22, the spacer joint portions 23, and the second spacer portion 25 that are coupled to one another, a position of the spacer portion 22 relative to the driver 12 and a position of the second spacer portion 25 relative to the CF substrate flexible printed circuit 14 are easily adjustable. This configuration can provide high workability in the production.

The liquid crystal display device 10 has the configuration described above. Next, a method of producing the liquid crystal display device 10 will be described. The method of producing the liquid crystal display device 10 includes at least a liquid crystal panel producing process for producing the liquid crystal panel 11, a backlight unit producing process for producing the backlight unit, a component producing step (a spacer producing step) for producing components of the liquid crystal panel 11 including the spacer 18, a component attaching step, and amounting step. The component attaching step includes attaching the components produced in the component producing step to the liquid crystal panel 11 produced in the liquid crystal panel producing process. The mounting process includes mounting the backlight unit and the cover glass 24 to the liquid crystal panel 11 to which the components are attached in the component attaching step.

Figure 8:
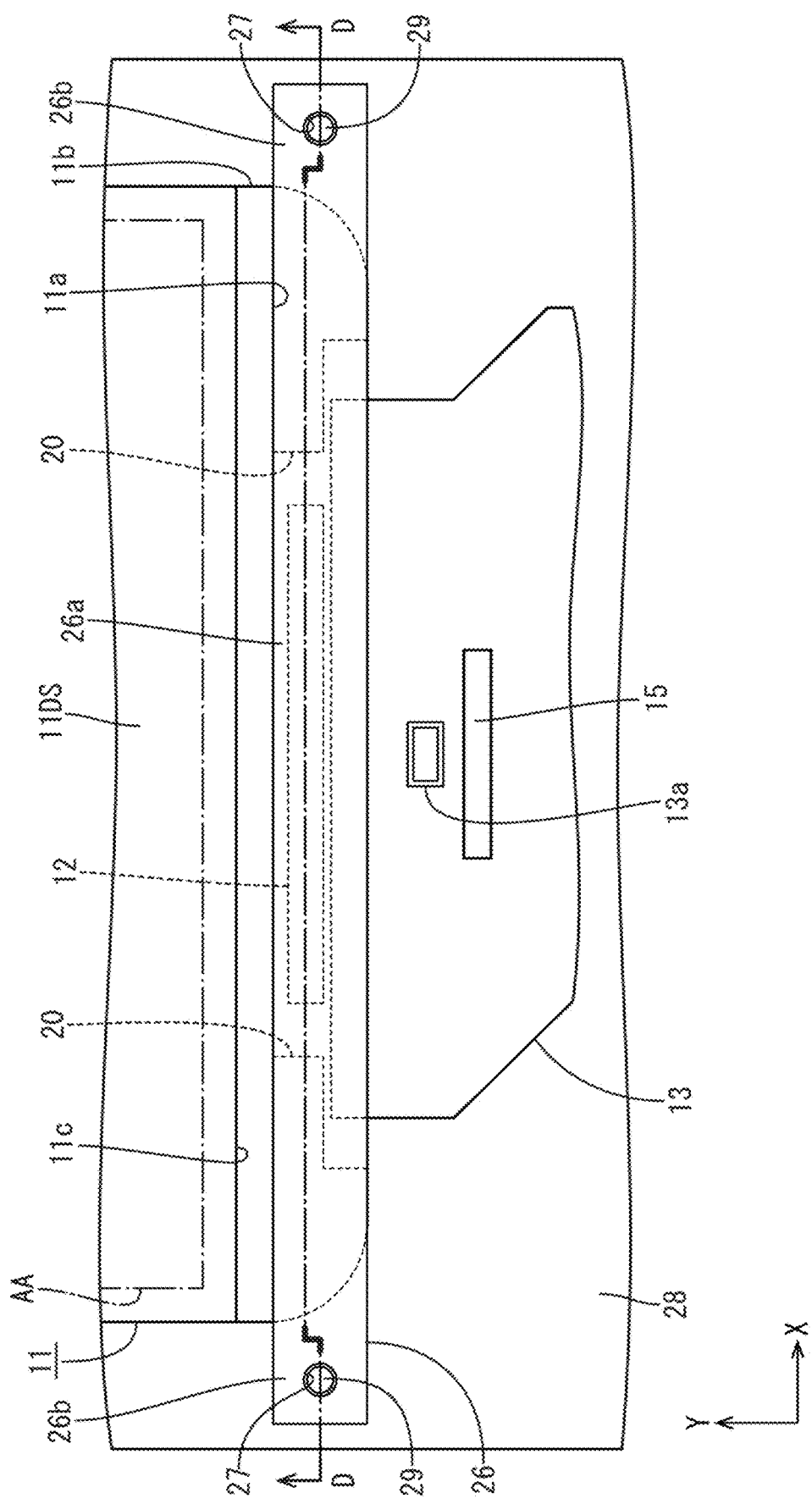
FIG. 8 is a plan view illustrating a liquid crystal panel and the spacer placed on a jig.

The liquid crystal panel producing process includes at least a substrate bonding step for bonding the array substrate 11b to the CF substrate 11a such that the array substrate 11b faces the CF substrate 11a and includes the CF substrate non-overlapping portion 11b1 that does not overlap the CF substrate 11a (see FIG. 4). The backlight unit producing process and the component producing process may be known processes. The spacer producing step included in the component producing step includes fixing the film 19 to the blocks 20 to produce the spacer 18. The film 19 and the blocks 20 are separately molded. A separator 26 is attached to the front of the spacer 18 to be detachable (see FIG. 8). As illustrated in FIG. 8, the separator 26 includes a spacer overlapping portion 26a and two spacer non-overlapping portions 26b. The spacer overlapping portion 26a overlap an entire area of the spacer 18. The spacer non-overlapping portions 26b protrude from sides of the spacer 18 in the X-axis direction not to overlap the spacer 18. The spacer non-overlapping portions 26b include separator-side positioning portions 27. The separator-side positioning portions 27 include through holes drilled through the spacer non-overlapping portions 26b in the thickness direction. The component attaching step (see FIG. 4) includes at least a driver mounting step (a driver circuit mounting step), an array substrate flexible printed circuit connecting step (a second substrate connecting member connecting step), a spacer disposing step, and a CF substrate flexible printed circuit connecting step (a first substrate connecting member connecting step). The driver mounting step includes mounting the driver 12 to the CF substrate non-overlapping portion 11*b*1 to overlap the driver 12 from the front side. The array substrate flexible printed circuit connecting step includes connecting the array substrate flexible printed circuit 13 to the CF substrate non-overlapping portion 11*b*1 to overlap the CF substrate non-overlapping portion 11*b*2 from the font side. The spacer disposing step includes disposing the spacer 18 on the CF substrate non-overlapping portion 11*b*1 to overlap the CF substrate non-overlapping portion 11*b*1 from the front side. The CF substrate flexible printed circuit connecting step includes connecting the CF substrate flexible printed circuit 14 to the end of the CF substrate 11*a* to overlap the CF substrate 11*a* from the front side.

Figure 9:
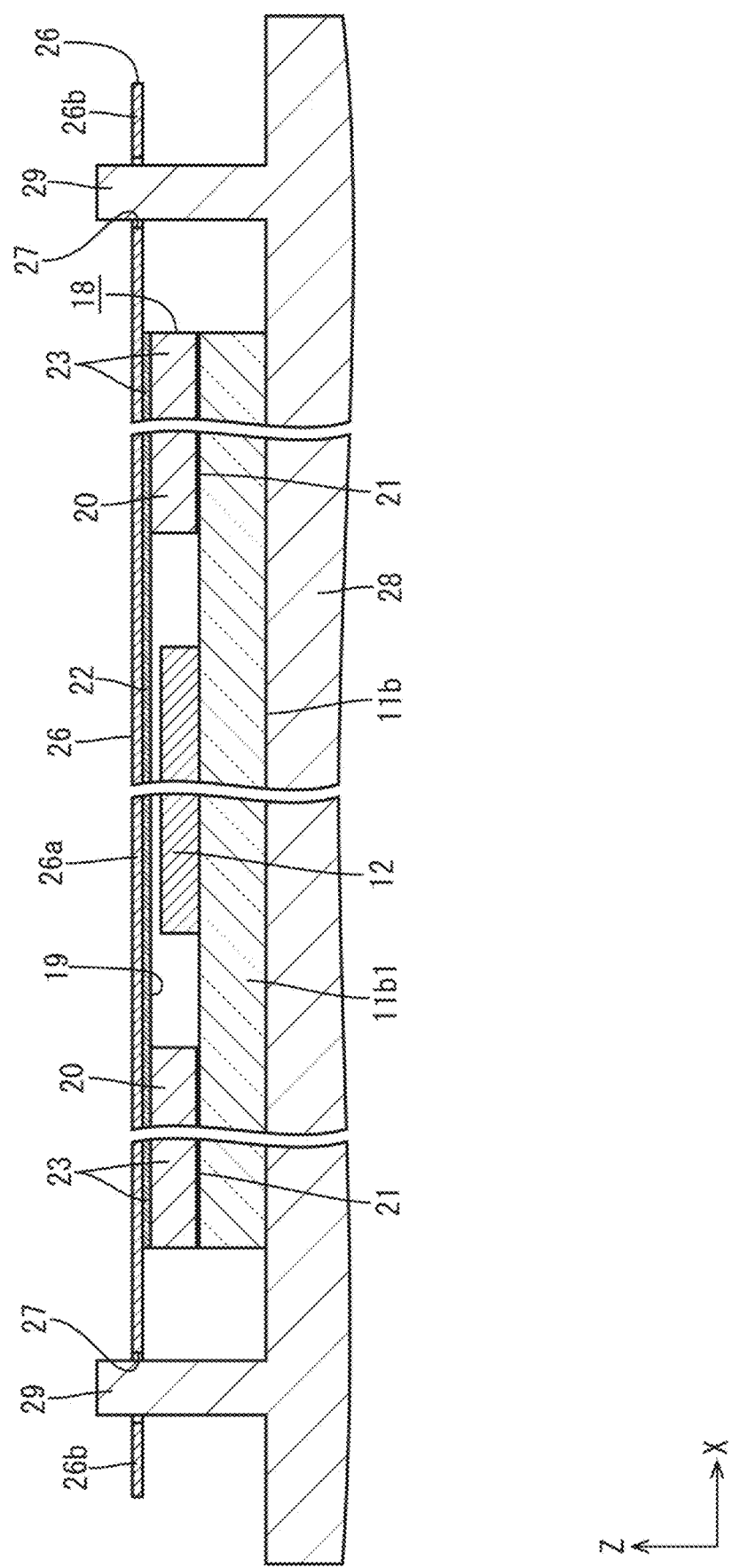
FIG. 9 is a cross-sectional view along line D-D in FIG. 8.

In the driver mounting step and the array substrate flexible printed circuit connecting step included in the component attaching step, the driver 12 and the array substrate flexible printed circuit 13 are mounted to the CF substrate non-overlapping portion 11*b*1 via the ACF (see FIG. 4). As illustrated in FIGS. 8 and 9, the spacer disposing step includes at least a substrate placing step and a spacer positioning step. The substrate placing step includes placing the liquid crystal panel 11 (the CF substrate 11*a* and the array substrate 11*b*) on the jig 28. The spacer positioning step includes positioning the spacer 18 to the CF substrate non-overlapping portion 11*b*1 using the separator 26 attached to the spacer 18. The jig 28 includes a panel positioning portion (not illustrated) and jig-side positioning portions 29. The panel positioning portion is for positioning the liquid crystal panel 11 in the X-axis direction and the Y-axis direction (a direction along the display surface 11DS). The jig-side positioning portions 29 are for positioning the separator 26 attached to the spacer 18. The jig-side positioning portions 29 are protrusions protruding from a holding surface of the jig 28 holding the liquid crystal panel 11 toward the front side. Two jig-side positioning portions 29 are provided at positions separated from each other in the X-axis direction on the holding surface.

As illustrated in FIGS. 8 and 9, in the spacer positioning step, the spacer 18 is brought closer to the CF substrate non-overlapping portion 11*b*1 from the front side and the jig-side positioning portions 29 are fitted in the separator-side positioning portions 27. The spacer portion 22 of the spacer 18 is arranged to properly overlap the driver 12 from the front side. The second spacer portion 25 is arranged to properly overlap the array substrate flexible printed circuit 13 from the front side. The spacer joint portions 23 are arranged to properly overlap sections of the CF substrate non-overlapping portion 11*b*1 not overlapping the driver 12 and the array substrate flexible printed circuit 13 from the front side. When the spacer 18 that is positioned as described above is attached to the CF substrate non-overlapping portion 11*b*1, the spacer portion 22 is disposed to overlap the driver 12 from the front side and the second spacer portion 25 is disposed to overlap the array substrate flexible printed circuit 13 from the front side. Furthermore, the spacer joint portions 23 are disposed to overlap the portions of the CF substrate non-overlapping portion 11*b*1 not overlapping the driver 12 and the array substrate flexible printed circuit 13 from the front side. The spacer joint portions 23 are fixed to the CF substrate non-overlapping portion 11*b*1 with the adhesive layers 21 on the back surfaces of the spacer joint portions 23. As a result, the spacer 18 is fixed to the CF substrate non-overlapping portion 11*b*1. The spacer portion 22 and the second spacer portion 25 do not include the adhesive layers 21 and thus adhere to the driver 12 and the array substrate flexible printed circuit 13 during the attachment. Therefore, the spacer portion 22 and the second spacer portion 25 are less likely to be wrinkled and thus higher workability can be achieved. When the attachment of the spacer 18 is complete, the separator 26 is removed from the spacer 18.

In the CF substrate flexible printed circuit connecting step, the CF substrate flexible printed circuit 14 is connected to the CF substrate 11*a* such that a portion of the CF substrate flexible printed circuit 14 is disposed to overlap the driver 12 and the spacer portion 22 is disposed between the CF substrate flexible printed circuit 14 and the driver 12 (see FIG. 4). Then, the power receiving connector 14*a* of the CF substrate flexible printed circuit 14 is fitted in and connected to the power supply connector 13*a* of the array substrate flexible printed circuit 13. Signals related to the position detection transmitted from the control circuit board to the array substrate flexible printed circuit 13 are processed by the touch driver 15 and supplied to the touch panel pattern on the CF substrate 11*a* via the CF substrate flexible printed circuit 14.

As described above, the liquid crystal display device 10 (the display device) in this embodiment includes the CF substrate 11*a* (the first substrate), the array substrate 11*b* (the second substrate), the driver 12 (the driver circuit), the CF substrate flexible printed circuit 14 (the first substrate connecting member), the spacer portion 22, and the spacer joint portions 23. The array substrate 11*b* includes the CF substrate non-overlapping portion 11*b*1 (the first substrate non-overlapping portion) that is a portion of the array substrate 11*b* not overlapping the CF substrate 11*a*. The driver 12 is mounted on the CF substrate non-overlapping portion 11*b*1 to overlap from the same side as the CF substrate 11*a*. The CF substrate flexible printed circuit 14 is connected to the CF substrate 11*a* and disposed such that a portion thereof overlaps the driver 12. The spacer portion 22 having the insulating property is disposed between the CF substrate flexible printed circuit 14 and the driver 12. The spacer joint portions 23 are disposed to overlap the portions of the CF substrate non-overlapping portion 11*b*1 not overlap at least the driver 12 from the same side as the CF substrate 11*a* and coupled to the spacer portion 22.

In the configuration described above, the CF substrate flexible printed circuit 14 connected to the CF substrate 11*a*. Furthermore, the array substrate 11*b* is opposed to the CF substrate 11*a* and the driver 12 is mounted on the CF substrate non-overlapping portion 11*b*1 that does not overlap the CF substrate 11*a* on the same side as the CF substrate 11*a*. The spacer portion 22 having the insulating property is disposed between the CF substrate flexible printed circuit 14 and the driver 12. According to the configuration, a short circuit is less likely to occur between the CF substrate flexible printed circuit 14 and the driver 12. The spacer joint portions 23 are disposed on the sections of the CF substrate non-overlapping portion 11*b*1 not overlapping at least the driver on the same side as the CF substrate 11*a*. Therefore, steps between the driver 12 disposed on the CF substrate non-overlapping portion 11*b*1 on the same side as the CF substrate 11*a* and the sections of the CF substrate non-overlapping portion 11*b*1 not overlapping the driver 12 can be compensated. If the stress is applied to the CF substrate non-overlapping portion 11*b*1, the concentration of the stress is less likely to occur in the specific area. Therefore, the CF substrate non-overlapping portion 11*b*1 and the driver 12 are less likely to be damaged. Because the spacer joint portions 23 are coupled to the spacer portion 22 and the number of parts is reduced, easiness in parts control increases. Furthermore, steps in assembly work are reduced. Namely, the configuration is preferable for reducing the production cost.

The array substrate flexible printed circuit 13 (the second substrate connecting member) is provided. The array substrate flexible printed circuit 13 is connected to the CF substrate non-overlapping portion 11b1 at the position on the opposite side from the CF substrate 11a relative to the driver 12. The spacer joint portions 23 are disposed not to overlap the array substrate flexible printed circuit 13. According to the configuration, the spacer joint portions 23 are less likely to adversely affect the connection between the CF substrate non-overlapping portion 11b1 and the array substrate flexible printed circuit 13.

The second spacer portion 25 is provided. The second spacer portion 25 is disposed between the CF substrate flexible printed circuit 14 and the array substrate flexible printed circuit 13. The second spacer portion 25 has the insulating property. The second spacer portion 25 is coupled to the spacer portion 22 and the spacer joint portions 23. When the spacer portion 22 is disposed between the driver 12 and the CF substrate flexible printed circuit 14, the second spacer portion 25 is disposed between the CF substrate flexible printed circuit 14 and the array substrate flexible printed circuit 13. If the spacer portion 22 is displaced toward the CF substrate 11a relative to the driver 12 during the attachment of the spacer portion 22, the spacer joint portions 23, and the second spacer portion 25, which are coupled to one another, to the CF substrate non-overlapping portion 11b1 of the array substrate 11b, the section of the second spacer portion 25 having the insulating property is disposed between the driver 12 and the CF substrate flexible printed circuit 14. Even if the spacer portion 22 is displaced relative to the driver 12, the second spacer portion 25 reduces the short circuit between the CF substrate flexible printed circuit 14 and the driver 12.

the spacer joint portions 23 are coupled to the spacer portion 22 and the second spacer portion 25 linearly in the arrangement direction in which the spacer portion 22 and the second spacer portion 25 are arranged. In comparison to the configuration in which spacer joint portions are coupled to the first spacer portion 22 and the second spacer portion 25 not linearly in the arrangement direction and bumps are present at the borders between the spacer portion 22 and the spacer joint portions or the second spacer portion 25 and the spacer joint portions, the concentration of stress is less likely to occur at the borders between the spacer portion 22 and the spacer joint portions 23 or the second spacer portion 25 and the spacer joint portions 23. Therefore, the borders between the spacer portion 22 and the spacer joint portions 23 or the second spacer portion 25 and the spacer joint portions 23 are less likely to be broken.

The adhesive layers 21 to be fixed to the CF substrate non-overlapping portion 11b1 are provided on the spacer joint portions 23 among the spacer portion 22, the spacer joint portions 23, and the second spacer portion 25. With the adhesive layers 21 fixed to the CF substrate non-overlapping portion 11b1, the spacer joint portions 23 are fixed to the CF substrate non-overlapping portion 11b1. Therefore, the concentration of stress is less likely to occur at the CF substrate non-overlapping portion 11b1. The adhesive layers 21 are not provided on the spacer portion 22 that is disposed between the driver 12 and the CF substrate flexible printed circuit 14 and the second spacer portion 25 that is disposed between the CF substrate flexible printed circuit 14 and the array substrate flexible printed circuit 13. During attachment of the spacer portion 22, the spacer joint portions 23, and the second spacer portion 25 that are coupled to one another, the position of the spacer portion 22 relative to the driver 12 and the position of the second spacer portion 25 relative to the CF substrate flexible printed circuit 14 are easily adjustable. This configuration can provide high workability in the production.

The spacer joint portions 23 have the thickness greater than the height of the driver 12 from the CF substrate non-overlapping portion 11b1. In comparison to the configuration including spacer joint portions having the thickness less than the height of the driver 12, the steps between the driver 12 mounted on the CF substrate non-overlapping portion 11b1 and the portions of the CF substrate non-overlapping portion 11b1 not overlapping the driver 12 can be more properly compensated by the spacer joint portions 23. Therefore, the concentration of the stress is less likely to occur when the stress is exerted on the CF substrate non-overlapping portion 11b1 and thus the CF substrate non-overlapping portion 11b1 and the driver 12 are less likely to be damaged.

The surfaces of the spacer joint portions 23 and the surface of the spacer portion 22 on the opposite side from the CF substrate non-overlapping portion 11b1 are flush with each other. According to the configuration, steps are less likely to be produced between the surfaces of the spacer joint portions 23 and the surface of the spacer portion 22 on the opposite side from the CF substrate non-overlapping portion 11b1.

The spacer joint portions 23 are disposed to sandwich the spacer portion 22 in the arrangement direction in which the spacer joint portions 23 are arranged relative to the spacer portion 22. Because the concentration of the stress on the CF substrate non-overlapping portion 11b1 can be reduced with the spacer joint portions 23 are disposed to sandwich the spacer portion 22 in the arrangement direction, the CF substrate non-overlapping portion 11b1 and the driver 12 are less likely to be damaged. The spacer joint portions 23 and the spacer portion 22 are the portions of a single component. This configuration is preferable for reducing the production cost.

The cover glass 24 (the substrate protecting member) is provided. The cover glass 24 is opposed to the CF substrate 11a on the opposite side from the array substrate 11b such that the driver 12, the spacer portion 22, and the CF substrate flexible printed circuit 14 are sandwiched between the cover glass 24 and the CF substrate non-overlapping portion 11b1. The CF substrate 11a and the array substrate 11b are protected with the cover glass 24. If the gap is provided between the cover glass 24 and the CF substrate flexible printed circuit 14, the CF substrate non-overlapping portion 11b1 tends to be subject to stress. With the spacer joint portions 23, the concentration of the stress in the specific area is less likely to occur in the CF substrate non-overlapping portion 11b1. Therefore, the CF substrate non-overlapping portion 11b1 and the driver 12 are less likely to be damaged.

The liquid crystal panel producing process includes at least the substrate bonding step, the driver mounting step (the driver circuit mounting step), the spacer disposing step, the CF substrate flexible printed circuit connecting step (the first substrate connecting member connecting step). The substrate bonding step includes bonding the array substrate 11b to the CF substrate 11a such that the array substrate 11b faces the CF substrate 11a and includes the CF substrate non-overlapping portion 11b1 that does not overlap the CF substrate 11a. The driver mounting step includes mounting the driver 12 to the CF substrate non-overlapping portion 11*b*1 to overlap the driver 12 from the same side as the CF substrate 11*a*. The spacer disposing step includes disposing the spacer portion 22 having the insulating property on the same side as the CF substrate 11*a*. The spacer disposing step further includes disposing the spacer joint portions 23 coupled to the spacer portion 22 such that the spacer joint portions 23 overlap the sections of the CF substrate non-overlapping portion 11*b*1 not overlapping at least the driver 12 from the same side as the CF substrate. The CF substrate flexible printed circuit connecting step includes connecting the CF substrate flexible printed circuit 14 to the CF substrate 11*a* such that a portion of the CF substrate flexible printed circuit 14 overlaps the driver 12 and such that the spacer portion 22 is sandwiched between the CF substrate flexible printed circuit 14 and the driver 12.

When the spacer disposing step is performed after the substrate bonding step and the driver mounting step are performed, the spacer portion 22 is disposed on the same side as the CF substrate 11*a* relative to the driver 12. Furthermore, the spacer joint portions 23 coupled to the spacer portion 22 are disposed in the sections of the CF substrate non-overlapping portion 11*b*1 not overlapping at least the driver 12 on the same side as the CF substrate 11*a*. With the spacer joint portions 23, the steps between the driver 12 mounted on the CF substrate non-overlapping portion 11*b*1 and the sections of the CF substrate non-overlapping portion 11*b*1 not overlapping the driver 12 are compensated. If the stress is exerted on the CF substrate non-overlapping portion 11*b*1, the concentration of the stress is less likely to occur in the specific area. Therefore, the CF substrate non-overlapping portion 11*b*1 and the driver 12 are less likely to be damaged. When the CF substrate flexible printed circuit connecting step is performed after the above steps, the CF substrate flexible printed circuit 14 is connected to the CF substrate 11*a* the portion of the CF substrate flexible printed circuit 14 is disposed to overlap the driver 12 and to sandwich the spacer portion 22 together with the driver 12. Because the spacer portion 22 having the insulating property is disposed between the CF substrate flexible printed circuit 14 and the driver 12, a short circuit is less likely to occur between the CF substrate flexible printed circuit 14 and the driver 12. Because the spacer joint portions 23 are coupled to the spacer portion 22 and the number of parts is reduced, easiness in parts control increases. Furthermore, the steps in assembly process are reduced. This configuration is preferable for reducing the production cost.

The spacer disposing step includes at least the substrate placing step and the spacer positioning step. The substrate placing step includes placing the CF substrate 11*a* and the array substrate 11*b* on the jig 28. In the spacer positioning step, the jig-side positioning portions 29 of the jig 28 are fitted in the separator-side positioning portions 27 in the spacer non-overlapping portions 26*b* of the separator 26 attached to the spacer portion 22 and the spacer joint portions 23 on the opposite side from the driver 12 to be detachable. Through the step, the spacer portion 22 and the spacer joint portions 23 are positioned. When the spacer positioning step is performed after the CF substrate 11*a* and the array substrate 11*b* are disposed on the jig 28 through the substrate arranging step, the spacer portion 22 and the spacer joint portions 23 attached to the separator 26 to be detachable through the fitting of the jig-side positioning portions 29 of the jig 28 in the separator-side positioning portions 27 in the spacer non-overlapping portions 26*b* of the separator 26 are positioned relative to the CF substrate non-overlapping portion 11*b*1 and the driver 12. Through the steps, the spacer portion 22 is properly disposed between the CF substrate flexible printed circuit 14 and the driver 12 and the spacer joint portions 23 are properly disposed to overlap the sections of the CF substrate non-overlapping portion 11*b*1 not overlapping the driver 12. After the positioning is performed as described above, the spacer portion 22 and the spacer joint portions 23 are attached to at least the CF substrate non-overlapping portion 11*b*1 and then the separator 26 is removed from the spacer portion 22 and the spacer joint portions.

Second Embodiment

A second embodiment of the present invention will be described with reference to FIG. 10. The second embodiment includes a spacer 118 having a configuration different from the first embodiment. Configurations, functions, and effects similar to the first embodiment will not be described.

Figure 10:
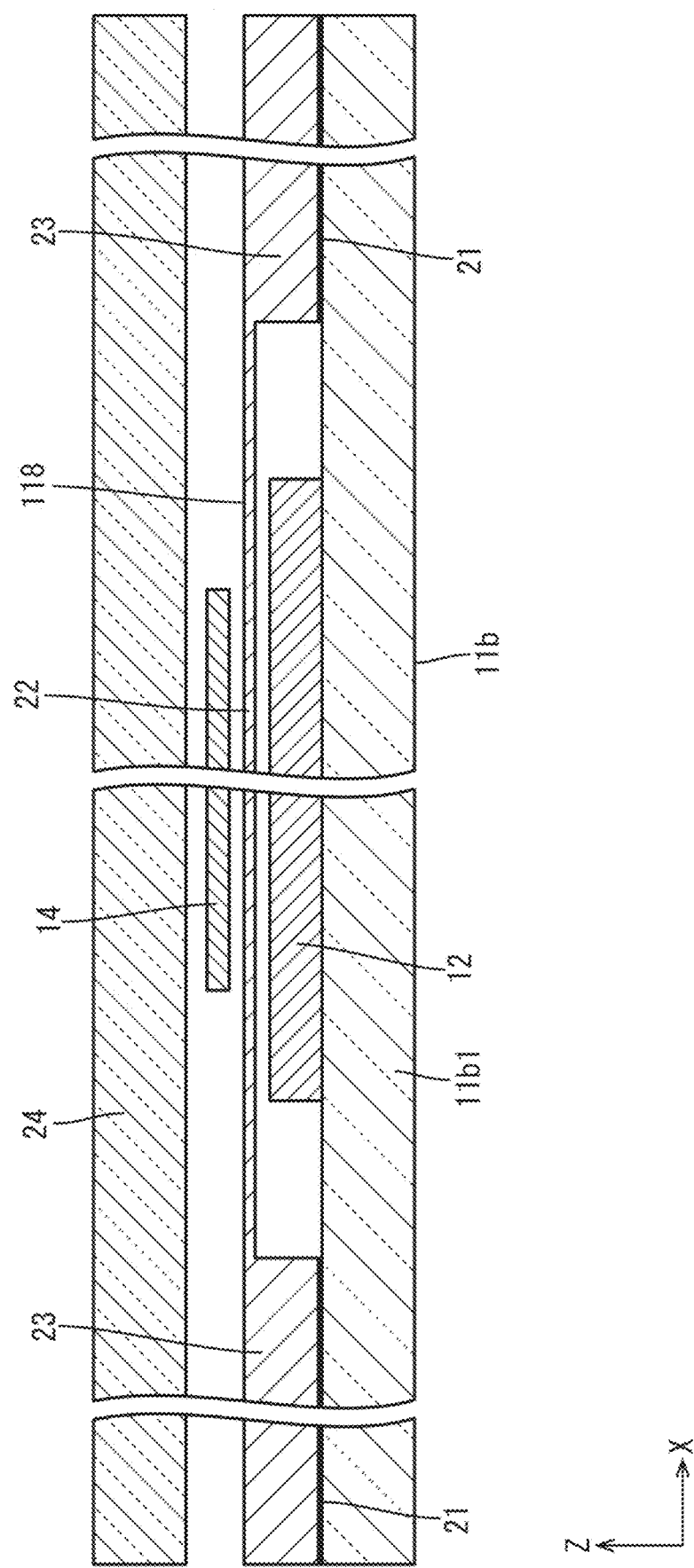
FIG. 10 is a cross-sectional view illustrating cross sections of a liquid crystal panel and a spacer included in a liquid crystal panel according to a second embodiment.

As illustrated in FIG. 10, the spacer 118 includes the film 19 and the blocks 20 included in the first embodiment (see FIG. 6) but the film 19 and the blocks 20 are integrated with each other in this embodiment. The spacer 118 is molded from one kind of material by a method such as injection molding. According to the configuration, the step for fixing the film 19 and the blocks 20 that are molded in different processes is not required. This configuration is more proper for reducing the production cost or improving the productivity.

Other Embodiment

The technology described herein is not limited to the embodiments described above and illustrated by the drawings. For example, the following embodiments will be included in the technical scope of the present invention.

(1) In each of the above embodiments, the spacer portion is opposed to the driver on the front side with the gap between the spacer and the driver. However, the spacer portion may be opposed to the driver on the front side and in contact with the front surface of the driver. The spacer portion may be opposed to and in contact with the back surface of the CF substrate flexible printed circuit other than the spacer portion that is opposed to the CF substrate flexible printed circuit on the back side with the gap between the spacer portion and the CF substrate flexible printed circuit.

(2) In each of the above embodiments, the touch driver is disposed on the array substrate flexible printed circuit and the second end of the CF substrate flexible printed circuit is connected to the array substrate flexible printed circuit. However, the touch driver may be disposed on the CF substrate flexible printed circuit and a second end of the CF substrate flexible printed circuit may be directly connected to the control circuit board. In such a configuration, a touch control circuit board may be provided in addition to the control circuit board and the second end of the CF substrate flexible printed circuit may be connected to the touch control circuit board.

(3) In each of the above embodiments, the thickness of the spacer joint portions is greater than the height of the driver from the CF substrate non-overlapping portion. However, the thickness of the spacer joint portions of may be about equal to or less the height of the driver from the CF substrate flexible printed circuit.

(4) In each of the above embodiments, the front surfaces of the spacer portion, the second spacer portion, and the spacer joint portions are flush with one another and the steps are less likely to present. However, slight steps may be present between the front surfaces of the spacer portion, the second spacer portion, and the spacer joint portions.

(5) Each of the above embodiments includes one driver and one spacer portion are provided. However, an embodiment may include multiple drivers and multiple spacer portions. Such an embodiment may include three or more spacer joint portions.

(6) In each of the above embodiments, the spacer joint portions that sandwich the spacer portion and the second spacer portion are provides. However, only one spacer joint portion may be provided.

(7) In each of the above embodiments, the spacer portion, the second spacer portion, and the spacer joint portions are linearly arranged in the X-axis direction. However, the spacer portion, the second spacer portion, and the spacer joint portions may be arranged not linearly in the X-axis direction and borders among them may be cranked (steps).

(8) In each of the above embodiments, the adhesive layers are not formed on the spacer portion and the second spacer portion. However, the adhesive layer may be formed on one of or each of the spacer portion and the second spacer portion.

(9) In each of the above embodiments, the cover glass is attached to the front of the liquid crystal panel. However, the cover glass may be omitted.

(10) In each of the above embodiments, the liquid crystal panel has the touch panel function. However, the liquid crystal panel may not have the touch panel function. In such a liquid crystal panel, the CF substrate flexible printed circuit may be configured to transmit signals (including a GND potential signal) other than the signals related to the touch panel.

(11) In each of the above embodiments, the planar shape of each touch electrode is rhombic. However, the planar shape of each touch electrode may be square, circular, or polygon with five or more corners.

(12) In each of the above embodiments, the touch panel pattern using the mutual capacitance technology is provided. However, the present invention may be applied to a touch panel pattern using the self-capacitance technology.

(13) In each of the above embodiments, the planar shape of the liquid crystal display device is vertically-long rectangular. However, the planar shape may be horizontally-long rectangular, square, or non-rectangular, for example, circular, oval, or trapezoidal.

(14) The screen size of the liquid crystal panel or the use of the liquid crystal display device may be altered from that of each of the above embodiments.

(15) In each of the above embodiments, the liquid crystal display device including the liquid crystal panel is provided. However, the present invention may be applied to liquid crystal display devices including other types of display panels (e.g., plasma display panels (PDPs), organic EL panels, electrophoretic display panels (EPDs), and micro electro mechanical systems (MEMS)). For self-luminous display panels, backlight units are not required.

EXPLANATION OF SYMBOLS

10: Liquid crystal display device (Display device), 11*a*: CF substrate (First substrate), 11*b*: Array substrate (Second substrate), 11*b*1: CF substrate non-overlapping portion (First substrate non-overlapping portion), 12: Driver (Driver circuit), 13: Array substrate flexible printed circuit (Second substrate connecting member), 14: CF substrate flexible printed circuit (First substrate connecting member), 21: Adhesive layer, 22: Spacer portion, 23: Spacer joint portion, 24: Cover glass (Substrate protecting member), 25: Second spacer portion, 26: Separator, 26*b*: Spacer non-overlapping portion, 27: Separator-side positioning portion, 28: Jig, 29: Jig-side positioning portion

The invention claimed is:

1. A display device comprising:
   a first substrate;
   a second substrate opposed to overlap the first substrate and including a first substrate non-overlapping portion not overlapping the first substrate;
   a driver circuit mounted on the first substrate non-overlapping portion on a same side as the first substrate;
   a first substrate connecting member connected to the first substrate and including a portion disposed to overlap the driver circuit;
   a spacer portion disposed between the first substrate connecting member and the driver circuit and having an insulating property; and
   at least one spacer joint portion disposed to overlap a section of the first substrate non-overlapping portion not overlapping at least the driver circuit on the same side as the first substrate.

2. The display device according to claim 1, further comprising a second substrate connecting member connected to a section of the first substrate non-overlapping portion on an opposite side from the first substrate relative to the driver circuit, wherein
   the at least one spacer joint portion is disposed not to overlap the second substrate connecting member.

3. The display device according to claim 2, further comprising a second spacer portion disposed between the first substrate connecting member and the second substrate connecting member, the second spacer portion having an insulating property and being coupled to the spacer portion and the at least one spacer joint portion.

4. The display device according to claim 3, wherein the at least one spacer joint portion is coupled to the spacer portion and the second spacer portion linearly in an arrangement direction in which the spacer portion and the second spacer portion are arranged.

5. The display device according to claim 3, further comprising an adhesive layer affixed to the first substrate non-overlapping portion, the adhesive layer being formed on the at least one spacer joint portion among the spacer portion, the at least one spacer joint portion, and the second spacer portion.

6. The display device according to claim 1, wherein the at least one spacer joint portion has a thickness equal to or greater than a height of the driver circuit from the first substrate non-overlapping portion.

7. The display device according to claim 1, wherein the at least one spacer joint portion includes a surface on an opposite side from the first substrate non-overlapping portion flush with a surface of the spacer portion on the opposite side.

8. The display device according to claim 1, wherein the at least one spacer joint portion includes two spacer joint portions that sandwich the spacer portion in an arrangement direction in which the spacer joint portions and the spacer portion are arranged.

9. The display device according to claim 1, further comprising a substrate protecting member opposed to the first substrate on an opposite side from the second substrate such that the driver circuit, the spacer portion, and the first substrate connecting member are sandwiched between the substrate protecting member and the first substrate non-overlapping portion.

10. A method of producing a display device, the method comprising:
- a substrate bonding step of bonding the second substrate to the first substrate such that the second substrate is opposed to the first substrate and includes a first substrate non-overlapping portion not overlapping the first substrate;
- a driver circuit mounting step of mounting a driver circuit to the first substrate non-overlapping portion on a same side as the first substrate;
- a spacer disposing step of disposing a spacer portion having an insulating property on the first substrate non-overlapping portion on the same side as the first substrate and a spacer joint portion to a section of the first substrate non-overlapping portion not overlapping at least the driver circuit on the same side as the first substrate; and
- a first substrate connecting member connecting step of connecting a first substrate connecting member to the first substrate such that a portion of the first substrate connecting member overlaps the driver circuit and the spacer portion is sandwiched between the first substrate connecting member and the driver circuit.

11. The method according to claim 10, wherein the spacer disposing step includes:
- a substrate placing step of placing the first substrate and the second substrate on a jig; and
- a spacer positioning step of positioning the spacer portion and the spacer joint portion by fitting a jig-side positioning portion of the jig to a separator-side positioning portion of a separator to which the spacer portion and the spacer joint portion are attached on an opposite side from the driver circuit to be detachable, the separator-side positioning portion being located in a spacer non-overlapping portion of the separator not overlapping the spacer portion and the spacer joint portion.

* * * * *